(12) United States Patent
Pal et al.

(10) Patent No.: US 8,664,066 B2
(45) Date of Patent: Mar. 4, 2014

(54) FORMATION OF A CHANNEL SEMICONDUCTOR ALLOY BY FORMING A NITRIDE BASED HARD MASK LAYER

(75) Inventors: Rohit Pal, Clifton Park, NY (US); Stephan-Detlef Kronholz, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 20 days.

(21) Appl. No.: 13/552,722

(22) Filed: Jul. 19, 2012

(65) Prior Publication Data

US 2013/0040430 A1   Feb. 14, 2013

(30) Foreign Application Priority Data

Aug. 8, 2011   (DE) .......................... 10 2011 080 589

(51) Int. Cl.
*H01L 21/8234*   (2006.01)
(52) U.S. Cl.
USPC ................... 438/275; 257/392; 257/E21.638; 257/E21.639
(58) Field of Classification Search
USPC ........... 257/392, E21.638, E21.639; 438/142, 438/151, 199, 287, 275
See application file for complete search history.

(56) References Cited

U.S. PATENT DOCUMENTS

| 8,105,892 B2* | 1/2012 | Kim et al. ...................... 438/216 |
| 2002/0182893 A1 | 12/2002 | Ballantine et al. ............ 438/795 |
| 2011/0027952 A1 | 2/2011 | Kronholz et al. ............. 438/231 |

FOREIGN PATENT DOCUMENTS

DE   102009035418 A1   2/2011   ............ H01L 21/336

OTHER PUBLICATIONS

Translation of Official Communication from German Patent Office for German Patent Application No. 10 2011 080 589.3 dated Apr. 5, 2012.

* cited by examiner

*Primary Examiner* — David Vu
(74) *Attorney, Agent, or Firm* — Amerson Law Firm, PLLC (57) ABSTRACT

The present disclosure provides manufacturing techniques in which sophisticated high-k metal gate electrode structures may be formed in an early manufacturing stage on the basis of a selectively applied threshold voltage adjusting semiconductor alloy. In order to reduce the surface topography upon patterning the deposition mask while still allowing the usage of well-established epitaxial growth recipes developed for silicon dioxide-based hard mask materials, a silicon nitride base material may be used in combination with a surface treatment. In this manner, the surface of the silicon nitride material may exhibit a silicon dioxide-like behavior, while the patterning of the hard mask may be accomplished on the basis of highly selective etch techniques.

20 Claims, 9 Drawing Sheets

FORMATION OF A CHANNEL SEMICONDUCTOR ALLOY BY FORMING A NITRIDE BASED HARD MASK LAYER

BACKGROUND OF THE INVENTION

1. Field of the Invention

Generally, the present disclosure relates to integrated circuits including sophisticated transistor elements that comprise advanced gate structures including a metal-containing electrode and a high-k gate dielectric.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a material for a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel width. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architectures based on high-k dielectrics, additionally, transistor performance may also be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance, even at a less critical thickness, compared to a silicon dioxide layer, while additionally maintaining leakage currents at an acceptable level. On the other hand, a metal-containing non-polysilicon material, such as titanium nitride and the like, may be formed so as to directly connect to the high-k dielectric material, thereby substantially avoiding the presence of a depletion zone. Since the threshold voltage of the transistors is significantly affected by the work function of the gate material that is in contact with the gate dielectric material, an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has been proposed to appropriately adjust the threshold voltage of transistor devices by providing a specifically designed semiconductor material at the interface between the gate dielectric material and the channel region of the transistor device in order to appropriately "select" the band gap of the specifically designed semiconductor material with respect to the work function of the metal-containing gate electrode material, thereby obtaining the desired threshold voltage of the transistor under consideration. To this end, typically, a corresponding specifically designed semiconductor material, such as silicon/germanium and the like, may be provided by an epitaxial growth technique at an early manufacturing stage, which may also represent an additional complex process step, which, however, may avoid complex processes in an advanced stage of the overall process flow for adjusting the work function and thus the threshold voltages in a very advanced process stage.

It turns out, however, that the manufacturing sequence of forming the threshold adjusting semiconductor alloy may have a significant influence on transistor characteristics, as will be described in more detail with reference to FIGS. 1a-1f.

Figure 1A:
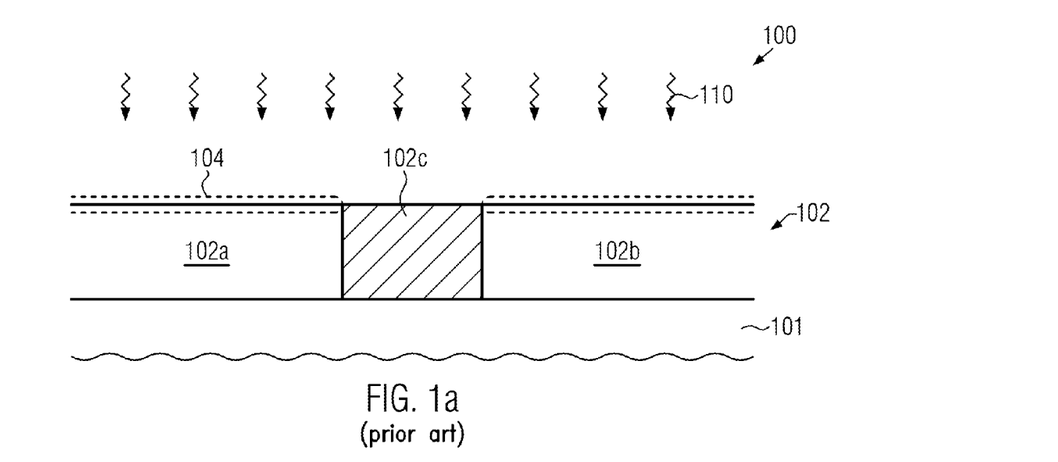
FIGS. 1a-1f schematically illustrate cross-sectional views of a conventional semiconductor device in which high-k metal gate electrode structures are formed on the basis of a silicon/germanium alloy for adjusting a threshold voltage of P-channel transistors, which may result in a pronounced surface topography of isolation regions.

FIG. 1a schematically illustrates a cross-sectional view of a semiconductor device 100 comprising a substrate 101 above which is formed a silicon-based semiconductor material 102 having an appropriate thickness for forming therein and thereabove transistor elements. Furthermore, an isolation structure 102c is formed in the semiconductor layer 102, thereby laterally delineating and thus defining active regions 102a, 102b. In this context, an active region is to be understood as a semiconductor material in which an appropriate dopant profile is formed or is to be created in order to form PN junctions for one or more transistor elements. In the example shown in FIG. 1a, the active region 102a corresponds to a P-channel transistor while the active region 102b represents an N-channel transistor. That is, the active regions 102a, 102b comprise an appropriate basic dopant concentration in order to determine the conductivity of a P-channel transistor and an N-channel transistor, respectively. It should be appreciated that the active regions 102a, 102b may comprise or may receive other components, such as germanium, carbon and the like, in order to appropriately adjust the overall electronic characteristics. Similarly, in the active region 102a, an appropriate valence band offset is to be adjusted with respect to a sophisticated gate electrode structure still to be formed by forming an appropriate semiconductor alloy, as will be described later on.

The semiconductor device 100 as illustrated in FIG. 1a may be formed on the basis of the following conventional process strategies. The isolation structure 102c is formed by well-established lithography, etch, deposition, planarization and anneal techniques, in which appropriate hard mask layers, such as a pad oxide and a silicon nitride material, are formed on the semiconductor layer 102, followed by the patterning of a trench in the semiconductor layer 102. Thereafter, the trench is filled with an appropriate insulating material, such as silicon dioxide and the like. It should be appreciated that the process sequence for forming the isolation structure 102c may result in a more or less pronounced stress level in the active regions 102a, 102b. After the removal of any excess material and planarizing the surface topography, the further processing is typically continued by performing a plurality of implantation processes using an appropriate masking regime in order to introduce the required dopant species for generating the basic dopant concentration in the active regions 102a, 102b, as required in view of the transistors to be formed therein and thereabove. After activating the dopant species and re-crystallizing implantation-induced damage, the further processing is continued by removing any material residues, such as oxide materials, and exposing the device 100 to an oxidizing ambient 110, which is typically established on the basis of elevated temperatures, for instance in the range of 700-1200° C. Consequently, during the dry oxidation process 110, a mask layer 104 is formed in a well-controllable manner during the process 110. For example, a maximal thickness of the mask layer 104 is adjusted to 10 nm or less.

Figure 1B:
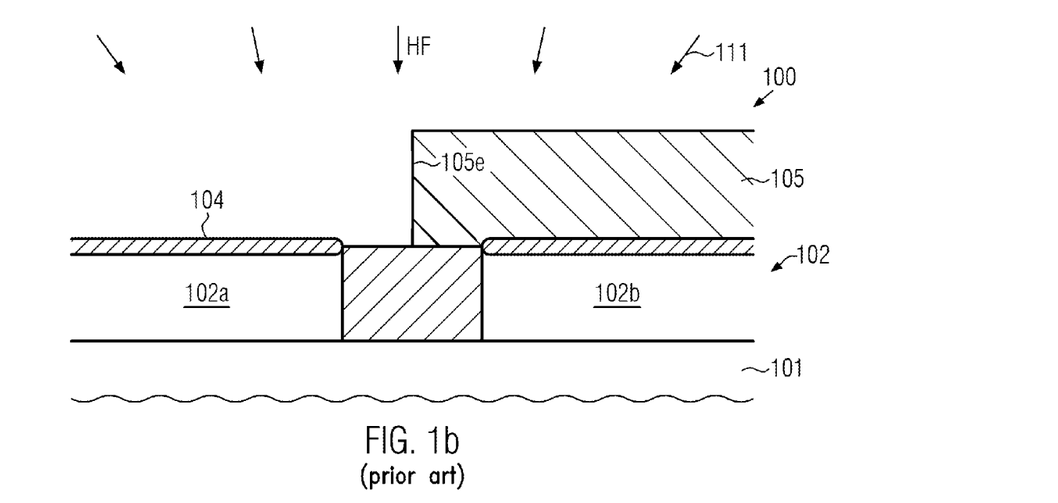

FIG. 1b schematically illustrates the semiconductor device 100 in a further advanced manufacturing stage in which an etch mask 105 in the form of a resist material is formed above the semiconductor device 100 such that the active region 102b and a part of the isolation structure 102c, i.e., the mask material 104, are covered by the mask 105, while the active region 102a, i.e., the mask material 104 formed thereon, and the remaining part of the isolation structure 102c, are exposed to a wet chemical etch ambient 111 in order to selectively remove the mask material 104 from the active region 102a. During the etch process 111, which is typically performed on the basis of diluted hydrofluoric acid (HF), the resist material 105 has to withstand the etch attack, wherein, in particular, the edge 105e of the mask 105 positioned above the isolation structure 102c may be increasingly eroded during the etch process 111. For example, an etch time of several minutes may be required in order to reliably remove the mask material 104 from the active region 102a. Due to the increasing erosion of the edge region 105e, the boundary between the mask area and the nonmask area in the isolation region 102c may not be well defined and may thus result in a certain degree of "roughness" due to the varying degree of material erosion, which may affect the further processing of the device 100, in particular when the active regions 102a, 102b represent closely-spaced active regions, which are thus laterally delineated by the isolation region 102c including the eroded surface area.

Figure 1C:
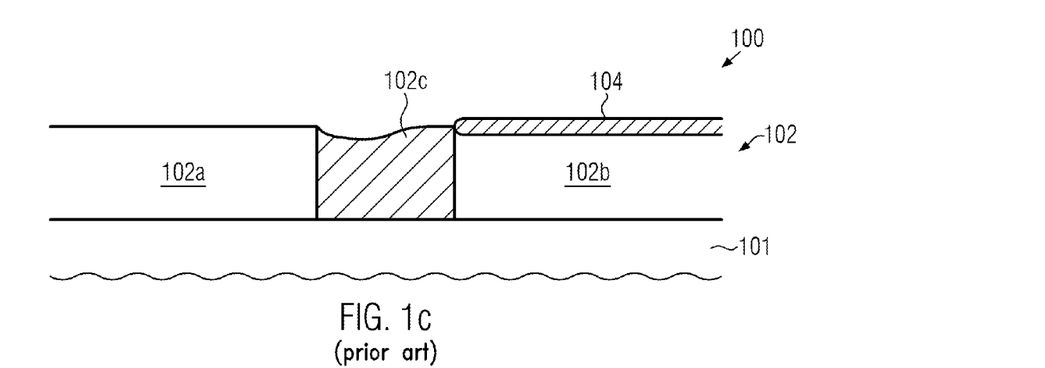

FIG. 1c schematically illustrates the semiconductor device 100 in a further advanced manufacturing stage, i.e., after the selective removal of the mask material 104 from above the active region 102a and after the removal of the etch mask 105 (FIG. 1b). As discussed above, due to the preceding etch sequence based on hydrofluoric acid, a certain material loss may occur in the isolation structure 102c, wherein the increasing mask erosion during the etch process may result in a non-well-defined transition area in the isolation region 102c.

Figure 1D:
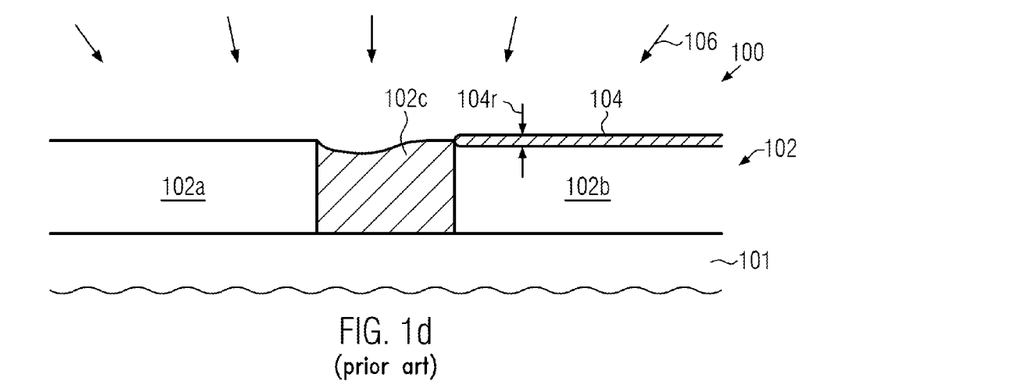

FIG. 1d schematically illustrates the semiconductor device 100 when exposed to a further reactive process ambient 106, which may include a cleaning process and the like in order to prepare the device 100 for the subsequent deposition of a silicon/germanium alloy selectively on the first active region 102a. The process 106 may be established on the basis of any appropriate chemistry in order to remove contaminants and the like which may have been produced during the previous removal of the etch mask and the like. Typically, the cleaning process 106 may cause a certain degree of material erosion of the mask 104, thereby reducing its thickness, as indicated by 104r, however, without exposing the surface portions of the second active region 102b.

Figure 1E:
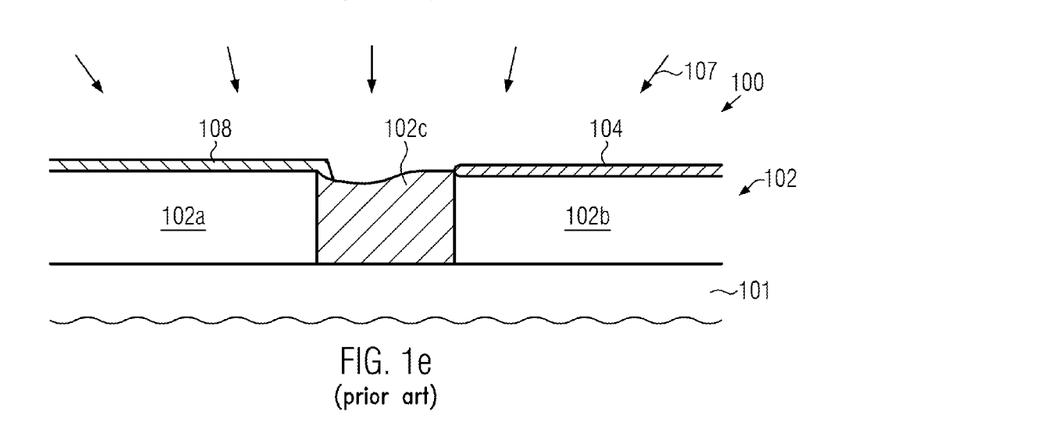

FIG. 1e schematically illustrates the semiconductor device 100 during a selective epitaxial growth process 107, in which process parameters, such as temperature, pressure, flow rates of precursor gases and the like, are appropriately selected such that a material deposition is substantially restricted to exposed silicon surface areas, while the silicon dioxide-based surface areas substantially prevent a deposition of material. That is, the deposition process 107 may be adjusted such that a certain degree of deposition selectivity is obtained with respect to silicon material in the active region 102a and any oxide surface areas, such as the deposition mask 104 and the isolation region 102c. To this end, gaseous HCl (hydrochloric acid) is added to the process atmosphere. As previously explained, the finally-obtained threshold voltage of a transistor to be formed in and above the active region 102a strongly depends on the characteristics of the silicon/germanium material 108, such as the germanium concentration thereof and the thickness, such that precisely determined process conditions have to be established during the process 107. After the deposition of the silicon/germanium alloy 108, which is now a part of the active region 102a having the appropriate band gap for forming thereon sophisticated gate electrode structures, the deposition mask 104 is removed, for instance, by using hydrofluoric acid, which in turn may also result in a certain material removal in the isolation region 102c, thereby contributing to a further pronounced surface topography between the active regions 102a, 102b and the isolation region 102c, which may additionally have a pronounced surface topography due to the previously-performed etch process 111 as described with reference to FIG. 1b.

Figure 1F:
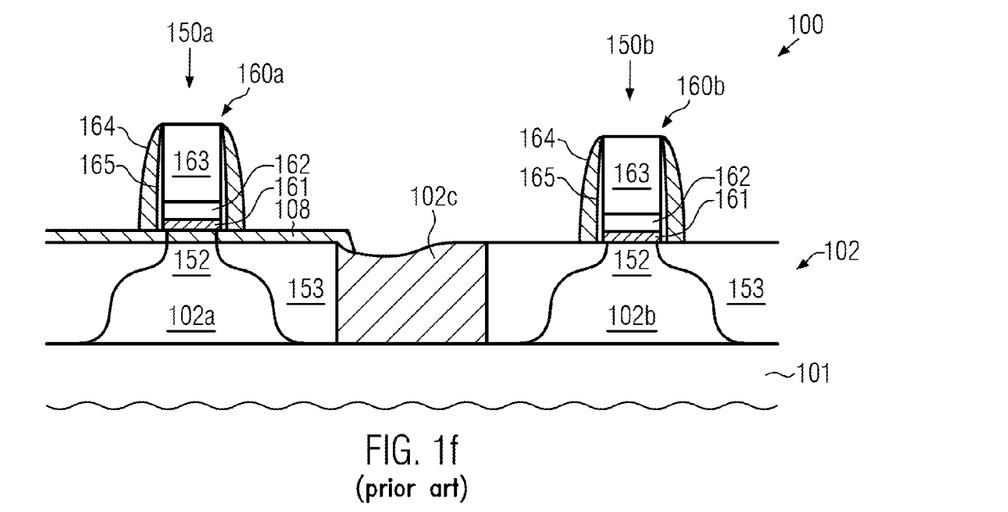

FIG. 1f schematically illustrates the semiconductor device 100 in a further advanced manufacturing stage, in which a transistor 150a is formed in and above the active region 102a, which now includes at least a portion of the silicon/germanium alloy 108. Similarly, a transistor 150b is formed in and above the active region 102b. Moreover, the transistors 150a, 150b, for instance representing a P-channel transistor and an N-channel transistor, respectively, comprise gate electrode structures 160a, 160b, respectively. As shown, the gate electrode structure 160a is formed on the threshold adjusting silicon/germanium alloy 108 and comprises a gate dielectric material 161, which includes a high-k dielectric material, wherein the gate dielectric material 161 is covered by a metal-containing electrode material 162. Moreover, a "conventional" electrode material 163, such as amorphous silicon, polycrystalline silicon and the like, is typically formed above the electrode material 162. Moreover, the sensitive materials 161 and 162 are laterally confined by an appropriate spacer or liner material 165, for instance, provided in the form of a silicon nitride material and the like. Furthermore, a sidewall spacer structure 164, which may comprise one or more spacer elements, possibly in combination with any etch stop liners, is provided according to the process and device requirements. The gate electrode structure 160b has a similar configuration, wherein, however, the gate dielectric material 161 is directly formed on the active region 102b. It should be appreciated that the gate electrode structures 160a, 160b may differ from each other with respect to the resulting work function of the material layers 162. That is, the transistor 150a may require a different work function so as to obtain, in combination with the silicon/germanium material 108, the desired threshold voltage for a P-channel transistor. To this end, any appropriate work function metal species, such as aluminum, may be incorporated into the layer 162 and/or the gate dielectric layer 161. Similarly, an appropriate work function metal species, such as lanthanum and the like, may be incorporated into the layer 162 and/or the layer 161 of the transistor 150b in order to obtain the desired threshold voltage.

The semiconductor device 100 as shown in FIG. 1f may be formed on the basis of any well-established process techniques, which include the deposition of the materials 161, 162 and 163, possibly in combination with other materials, such as dielectric cap layers, anti-reflective coating (ARC) materials and the like. As discussed above, appropriate patterning regimes and materials may be used for the layers 161 and 162 so as to obtain a desired high capacitive coupling in combination with a superior conductivity, while also obtaining a desired work function and thus threshold voltage for the transistor 150a, 150b, wherein the silicon/germanium alloy 108 provides the desired band gap offset.

During the patterning of the gate electrode structures 160a, 160b, the pronounced surface topography of the isolation region 102c, in particular in the vicinity of the active region 102a, may have a pronounced influence on the finally obtained cross-sectional shape of the gate electrode structures. In particular, the gate electrode structure 160a when extending into the isolation region 102c at end portions of the gate electrode structure 160a (not shown) may suffer from patterning irregularities due to the previously generated surface topography of the isolation region 102c. Since, in particular, the sensitive materials 162 and 161, which substantially determine the finally obtained electronic characteristics of the gate electrode structures 160a, 160b, have to be reliably confined by a liner or spacer 165, any pattern-related irregularities may cause reduced reliability of the encapsulation, which may result in significant yield loss or at least a variation of transistor characteristics, in particular of the transistor 150a. Consequently, although sophisticated deposition techniques may typically be applied so as to form a liner and patterning the liner into the spacer elements 165, nevertheless a significant probability of exposing the sensitive materials 161 and 162 may be encountered during the further processing when applying, in particular, aggressive wet chemical etch and cleaning processes. The pronounced surface topography of the isolation region 102c, in particular in the vicinity of the active region 102a, may even further contribute to device irregularities when a strain-inducing semiconductor material (not shown) is to be incorporated into the active region 102a. After forming an optional strain-inducing semiconductor material, such as a silicon/germanium material, the processing may be continued by forming the spacer structure 164 and applying appropriate implantation and masking regimes in order to form drain and source regions 153. Thereafter, an anneal process may be applied in order to adjust the final lateral and vertical profile of the drain and source regions 153, thereby also adjusting the final length of a channel region 152 of the transistors 150a, 150b.

Basically, the above-described process sequence is a very efficient process flow for providing transistors of different conductivity comprising sophisticated high-k metal gate electrode structures, the characteristics of which may be adjusted upon patterning these gate electrode structures, thereby avoiding any complex process steps for adjusting the transistor characteristics in a very advanced manufacturing stage. On the other hand, a significant variability of transistor characteristics may, however, be observed when fabricating the transistors on the basis of the process flow as described above. For example, the characteristics of the silicon/germanium alloy 108 may vary in a length direction, i.e., in FIG. 1f, along the horizontal direction, which, however, may not negatively affect the resulting transistor characteristics. On the other hand, a pronounced variation of the material characteristics is observed in the transistor width direction, i.e., in a direction perpendicular to the drawing plane of FIG. 1*f*, wherein basically the same edge effects are observed, which, for instance, are caused by the pronounced surface topography between the isolation region 102*c* and the active region 102*a*. Also, other negative influences may be caused by the previously used deposition mask 104 (FIGS. 1*a* and 1*b*) since the fabrication of this mask and the selective removal may result in different conditions in the center of the active region 102*a* compared to the edge region. Furthermore, the irregular surface topography of the isolation region 102*c*, for instance for closely spaced transistor devices, may also affect the process of forming the protective liner or spacer 165, which in turn may result in a deterioration of the sensitive materials 161 and 162 in one or both of the transistors 150*a*, 150*b*, thereby also contributing to a significant yield loss.

For this reason, it has been proposed to form the deposition mask on the basis of non-silicon dioxide material in order to significantly reduce the amount of hydrochloric acid so as to also reduce the degree of recessing of the isolation regions upon patterning the growth mask. For example, it has been proposed to use a silicon nitride material which may be patterned with high selectivity with respect to silicon dioxide and silicon, thereby enabling the patterning sequence of the growth mask, without unduly affecting the isolation regions. It turns out, however, that well-established selective epitaxial growth recipes, which may be used in combination with a silicon dioxide deposition mask, may not be efficiently used in combination with a silicon nitride material since a significantly higher amount of hydrochloric acid is required in the selective epitaxial deposition atmosphere, which in turn may have a significant influence on the material composition, the influence on other device areas and the like. As discussed above, it is very difficult to establish a reliable volume production process for implementing the silicon/germanium layer 108 so as to provide the desired electronic characteristics, so that using a silicon nitride deposition mask is less than desirable when forming sophisticated transistors including high-k metal gate electrode structures, unless significant modifications of the overall process flow are implemented.

In view of the situation described above, the present disclosure relates to manufacturing techniques in which a semiconductor alloy for adjusting the threshold voltage of a specific type of transistor may be selectively incorporated into active regions on the basis of a deposition mask, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the present disclosure provides manufacturing techniques in which a semiconductor alloy may be selectively formed in some active regions on the basis of a selective epitaxial growth recipe which, for instance, may be established on the basis of silicon dioxide deposition masks, wherein the degree of topography irregularities may be reduced upon patterning the deposition mask in order to enhance overall transistor uniformity and reduce yield losses due to gate failures when implementing sophisticated high-k metal gate electrode structures. To this end, a hard mask material may be used which exhibits a pronounced etch selectivity with respect to silicon dioxide material, wherein the surface characteristics of the hard mask material may be modified so as to provide a similar behavior as a silicon dioxide material. For this purpose, the hard mask material may be exposed to an appropriate process atmosphere so as to perform a surface treatment, for instance on the basis of an oxidizing ambient, thereby obtaining a very thin yet highly stable surface layer having similar characteristics compared to a silicon dioxide material. Consequently, well-established selective epitaxial growth techniques may be applied so as to obtain similar process results compared to conventional strategies in which a silicon dioxide deposition mask is used, while at the same time the patterning of the hard mask may be accomplished with a significantly reduced degree of recessing of isolation regions.

One illustrative method disclosed herein comprises forming a hard mask layer on a first active region and a second active region of a semiconductor device. The method further comprises performing a surface treatment in an oxidizing atmosphere so as to form an oxidized surface of the hard mask layer. The hard mask layer is then selectively removed from the first active region and a layer of semiconductor alloy is formed on the first active region by using the hard mask layer on the second active region as a growth mask. The method further comprises forming a first gate electrode structure of a first transistor on the layer of a semiconductor alloy and forming a second gate electrode structure of a second transistor on the second active region, wherein the first and second gate electrode structures comprise a metal-containing electrode material and a gate insulation layer comprising a high-k dielectric material.

A further illustrative method disclosed herein relates to forming a semiconductor device. The method comprises forming a silicon and nitrogen-containing hard mask layer on a first active region and a second active region. The method further comprises performing a surface treatment so as to modify a surface of the hard mask layer. Moreover, the hard mask layer is selectively removed from the first active region and a layer of the semiconductor alloy is formed in the first active region by using the hard mask layer as a growth mask. Additionally, the method comprises forming a first gate electrode structure of a first transistor on the first active region that includes the layer of a semiconductor alloy and forming a second gate electrode structure of a second transistor on the second active region.

A further illustrative method disclosed herein comprises forming a silicon nitride layer on a first active region and a second active region of a semiconductor device. Moreover, a surface of the silicon nitride layer is oxidized and the silicon nitride layer is then selectively removed from the first active region. The method further comprises forming a layer of a semiconductor alloy on the first active region and using the silicon nitride layer having the oxidized surface as a growth mask in the second active region. The method further comprises performing an etch process so as to expose the second active region. Additionally, the method comprises forming a first gate electrode structure on the first active region and a second gate electrode structure on the second active region prior to completing drain and source regions in the first and second active regions. The first and second gate electrode structures comprise a high-k dielectric material and a metal-containing electrode material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides process techniques in which the threshold voltage adjusting semiconductor alloy, such as a silicon/germanium alloy, may be selectively formed in one type of transistor on the basis of a well-defined deposition recipe, which may, for instance, be established on the basis of a deposition growth mask comprised of silicon dioxide. In this case, a plurality of efficient deposition recipes may be used, which provide desired process results in terms of material composition and layer thickness, thereby contributing to uniform transistor characteristics. On the other hand, the deposition mask formed on the basis of the principles disclosed herein may be patterned with superior selectivity, in particular with respect to silicon dioxide material, thereby reducing to a significant degree the recessing of isolation regions, which has been identified as a major source of transistor non-uniformities and yield loss in conventional process strategies, as described above. The hard mask material may be provided in the form of non-silicon dioxide material, such as a silicon and nitrogen-containing material, which may include other atomic species such as hydrogen, oxygen and the like, however, at a significantly lesser degree compared to the main components silicon and nitrogen. It should be appreciated that a silicon and nitrogen-containing layer may also be referred to as a silicon nitride layer, wherein, however, the fraction of silicon and nitrogen may significantly deviate from the stoichiometric ratio given by the formula $SE_3N_4$. The silicon nitride material may be formed by deposition, for instance, prior to or after forming corresponding isolation regions on the basis of any well-established deposition recipes, such as plasma enhanced chemical vapor deposition (CVD) and the like, with desired material characteristics and an appropriate thickness. On the other hand, the surface of the hard mask layer may be treated so as to modify its characteristics so as to "simulate" the behavior of a silicon dioxide material during the selective epitaxial growth process, thereby enabling the usage of well-established and efficient selective epitaxial growth recipes. To this end, the hard mask layer may be exposed to an oxidizing ambient which may, in some illustrative embodiments, be established in a similar manner compared to a dry oxidation process, thereby "oxidizing" the surface of the mask layer, for instance providing a silicon oxynitride surface layer with high stability and a reduced thickness so that basically the patterning of the hard mask layer may be performed on the basis of etch recipes that are selected so as to remove the base material of the hard mask layer, for instance the silicon nitride material. In some illustrative embodiments, the patterning of the hard mask layer may be accomplished on the basis of a plasma assisted etch process, thereby providing superior process uniformity and also avoiding the usage of aggressive wet chemical etch recipes. Consequently, superior uniformity of the resulting gate electrode structures may be achieved while still enabling the application of well-established selective epitaxial growth techniques.

With reference to FIGS. 2a-2j, further illustrative embodiments will now be described in more detail, wherein reference may also be made to FIGS. 1a-1f, if appropriate.

Figure 2A:
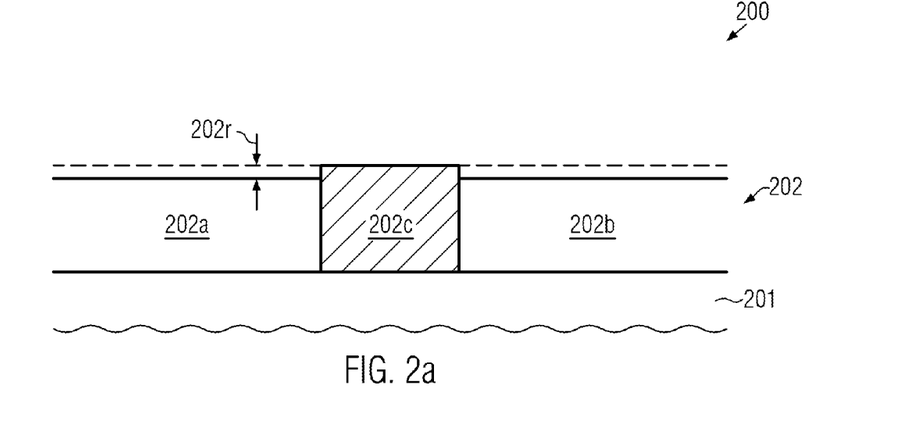
FIGS. 2a-2e schematically illustrate cross-sectional views of a semiconductor device during various manufacturing stages when a threshold voltage adjusting semiconductor material is formed selectively in one type of active region on the basis of a growth mask having similar surface characteristics as a silicon dioxide material, while enabling selective patterning of the growth mask with respect to silicon dioxide material, according to illustrative embodiments.

FIG. 2a schematically illustrates a cross-sectional view of a semiconductor device 200 comprising a substrate 201 and a semiconductor layer 202 in which active regions 202a, 202b are laterally delineated by an isolation region 202c. The active region 202a may represent the active region of a transistor that requires a semiconductor alloy for adjusting the threshold voltage, as discussed above. On the other hand, a corresponding threshold voltage adjusting semiconductor alloy is not required in the active region 202b. In the manufacturing stage shown, a more or less pronounced degree of recessing 202r may be implemented in one or both of the active regions 202a, 202b in order to take into consideration the overall surface topography of the device 200 after the incorporation of a semiconductor alloy in the active region 202a. It should be appreciated, however, that the recessing 202r may be selected differently for the active regions 202a, 202b, depending on the previous processing and also depending on the subsequent processing, wherein the recessing in the region 202a may be provided or may be increased prior to actually forming a threshold voltage adjusting semiconductor alloy. In this manner, a corresponding asymmetry caused by the additional deposition of the semiconductor alloy selectively in the active region 202a may be compensated for, if considered appropriate. In other illustrative embodiments (not shown), a hard mask material, for instance comprising a silicon nitride material, may be formed above the active regions 202a, 202b, wherein a thickness of a corresponding hard mask layer may be appropriately adapted during the further processing so as to enable the formation of a threshold voltage adjusting semiconductor material in the active region 202a. It should be appreciated that any such hard mask layer or layer system may represent a mask material that may have been used upon forming the isolation region 202c on the basis of sophisticated shallow trench isolation techniques.

The semiconductor device 200 as shown in FIG. 2a may be formed on the basis of any well-established process technique, as is, for instance, also described with reference to the device 100.

Figure 2B:
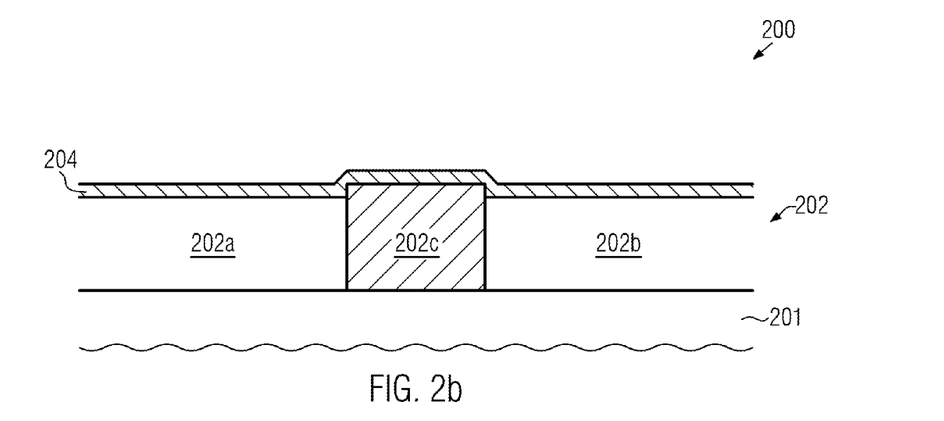

FIG. 2b schematically illustrates the device 200 with a hard mask layer 204 formed above the first and second active regions 202a, 202b. Furthermore, in the embodiment shown, the hard mask layer 204 may also be formed above the isolation region 202c. In some illustrative embodiments, the layer 204 is comprised of a silicon and nitrogen-containing base material, which may also be referred to as a silicon nitride material, wherein it is to be understood that other atomic species, such as hydrogen, oxygen, carbon and the like, may also be present in the layer 204. However, the fraction of any of such other atomic species may be 5 atomic percent or less. The hard mask layer 204 may be formed on the basis of appropriate deposition techniques, for instance plasma enhanced CVD and the like, wherein, if considered appropriate, a very thin etch stop layer, such as a silicon dioxide material (not shown), may be provided in the layer 204 so as to enhance controllability of a subsequent patterning process. Moreover, as discussed above with reference to FIG. 2a, a portion of the layer 204 may already be present on the active regions 202a, 202b, for instance as the residue of a hard mask material for forming the isolation region 202c, and the thickness of this layer may be increased to an appropriate value by performing an additional deposition process. Generally, the layer 204 may be provided with any appropriate thickness, for instance in the range of 5-30 nm, while it is to be understood that the thickness may be adapted to the overall process requirements.

Figure 2C:
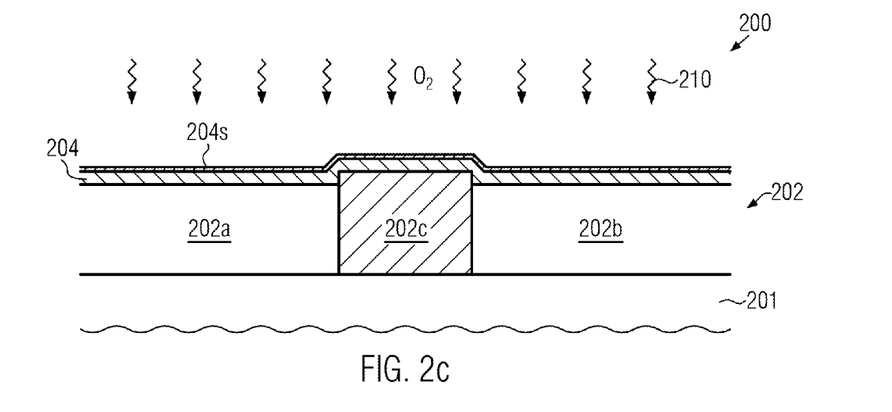

FIG. 2c schematically illustrates the device 200 when exposed to a process atmosphere 210 in which a surface treatment may be performed on the hard mask layer 204. In some illustrative embodiments, the treatment 210 is performed in a highly oxidizing ambient, which may be established on the basis of gaseous oxygen and hydrogen, thereby forming a thin surface layer 204s in the material 204, which thus has incorporated therein a significant amount of oxygen, which imparts surface characteristics to the layer 204, which are similar to the surface characteristics of a silicon dioxide layer. Hence, the surface 204s, which is to be understood as a surface layer having a thickness less than one nanometer to several nanometers, depending on the process parameters used in the treatment 210, provides surface characteristics during a selective deposition recipe which are very similar to the surface characteristics of a silicon dioxide hard mask. In some illustrative embodiments, the process atmosphere 210 is established on the basis of process temperatures of 700-1100° C., for instance, in one particular embodiment, a range of approximately 800-1000° C. may be applied in an appropriate process environment, such as a furnace and the like. The atmosphere 210 may be established with a pressure of approximately 3-20 Torr when using oxygen and hydrogen gas at a process temperature as specified above. In this case, an efficient oxidation of the layer 204 may be achieved, thereby forming the modified surface 204s.

Figure 2D:
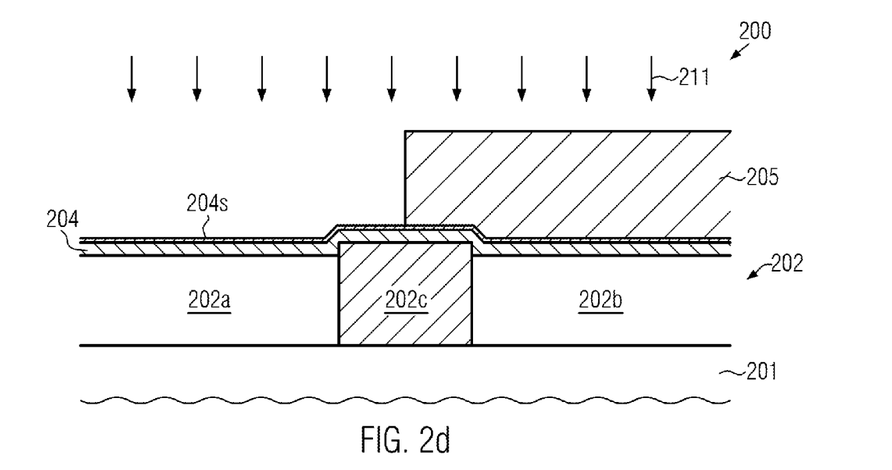

FIG. 2d schematically illustrates the device 200 with an etch mask 205 formed above the active region 202b and a portion of the isolation region 202c. Furthermore, an etch process 211 is performed so as to remove the exposed portion of the mask layer 204 comprising the modified surface 204s. In some illustrative embodiments, the etch process 211 may comprise a plasma assisted etch process in which, in an initial step, it may be etched through the surface layer 204s and subsequently the base material of the layer 204 may be removed, which may be accomplished on the basis of well-established etch recipes for removing silicon nitride material. It should be appreciated that these etch recipes may have a high etch selectivity with respect to silicon dioxide material, thereby significantly reducing the degree of material erosion in the isolation region 202c at a final phase of the etch process, while also superior uniformity of the etch result may be obtained due to the plasma nature of the process 211 compared to wet chemical etch recipes. It should be appreciated, however, that the etch process 211 may also include a wet chemical cleaning process, for instance for removing a very thin etch stop layer (not shown), thereby, however, not unduly affecting the isolation region 202c.

Figure 2E:
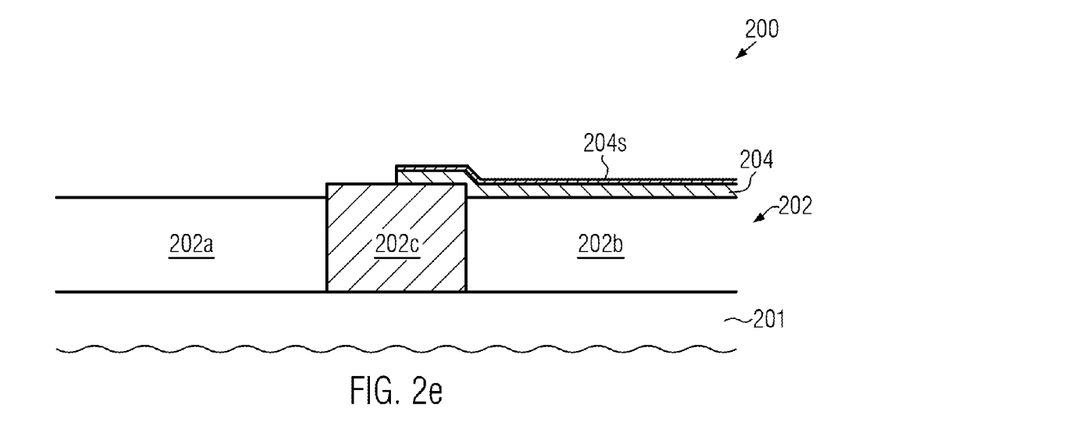

FIG. 2e schematically illustrates the device 200 in a manufacturing stage wherein the active region 202a may be prepared for receiving a selectively grown semiconductor alloy, while the remaining portion of the hard mask layer 204 comprising the modified surface 204s reliably covers the second active region 202b. It should be appreciated that the device 200 may be exposed to certain cleaning processes for removing contaminants and etch residues, wherein, however, the surface 204s may remain intact due to its superior stability, which may be obtained by the high temperature oxidation process described above with reference to FIG. 2c. Hence, the silicon oxide-like surface characteristics of the surface 204s may be preserved.

Moreover, if required, the degree of recessing of the active region 202a may be increased in this manufacturing stage, for instance by performing any appropriate etch process, such as an in situ process with respect to the subsequent selective epitaxial growth process, if a further recessing of the region 202a is considered appropriate for adjusting a desired final surface topography.

Figure 2F:
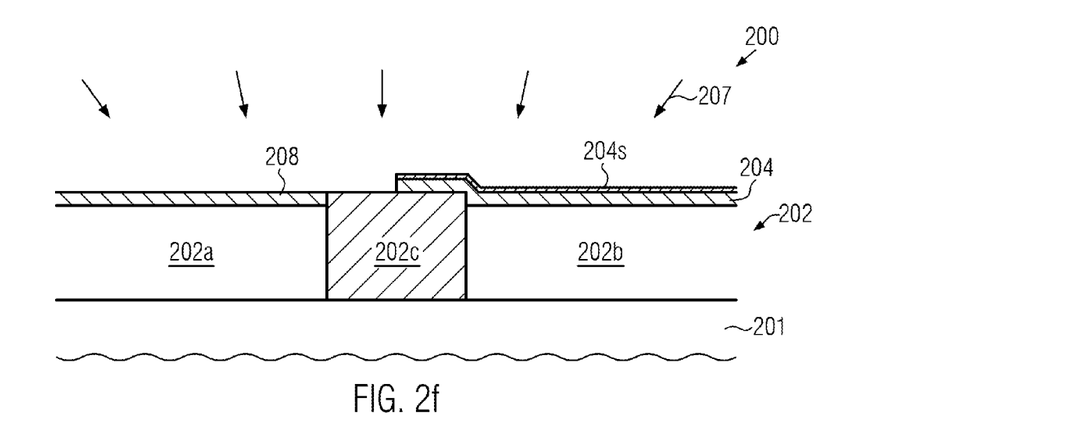
FIG. 2f schematically illustrates a graph illustrating the similarity of the epitaxial growth process performed on a given process recipe for a silicon dioxide hard mask material in comparison to a surface treated hard mask material of superior etch selectivity with respect to silicon dioxide material according to illustrative embodiments.

FIG. 2f schematically illustrates the device 200 during a selective epitaxial growth process 207 wherein a process recipe may be applied, which may be established for silicon dioxide hard mask materials, as discussed above. In this case, a well-established process recipe may be applied so as to form a silicon/germanium alloy 208 with appropriate composition and thickness as required in view of the overall characteristics of a transistor still to be formed in and above the active region 202a. On the other hand, the silicon dioxide-like characteristics of the surface 204s may efficiently avoid undue material deposition for the given amount of hydrochloric acid that is supplied to the deposition ambient of the process 207 and which is typically selected to be appropriate for a silicon dioxide-type hard mask material. Significant efforts with respect to doping new selective deposition recipes for non-silicon dioxide materials may be avoided and thus any non-predictable side effects of any such newly developed deposition recipes may be avoided.

Figure 2G:
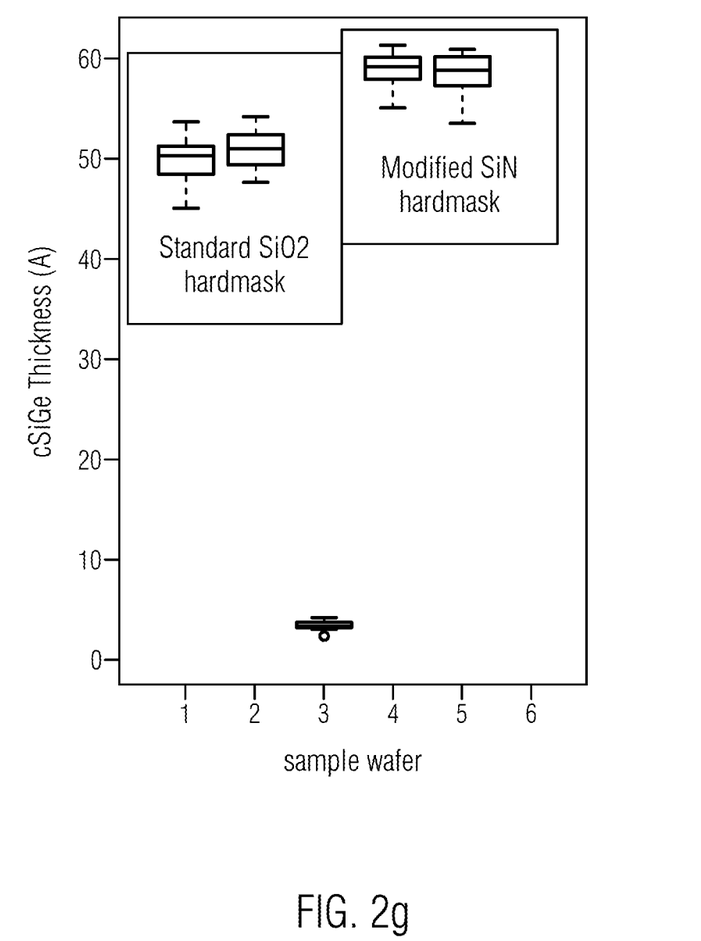
FIGS. 2g-2k schematically illustrate cross-sectional views of the semiconductor device in further advanced manufacturing stages according to still further illustrative embodiments.

FIG. 2g schematically illustrates a graph in which the process results of the process 207 of FIG. 2f are illustrated. The horizontal axis represents the identification number of sample substrates used for forming the material layer 208 of FIG. 2f on the basis of a standard silicon dioxide hard mask, as is for instance described with reference to the device 100, compared to the layer 208 when formed in the presence of the hard mask layer 204 having the modified surface 204s of FIG. 2f. As is evident from FIG. 2g, for the standard silicon dioxide hard mask, a thickness of approximately 50 Å for a specified deposition time is obtained for a given deposition recipe, while approximately 60 Å are obtained for the hard mask layer 204. Hence, the selective epitaxial growth process 207 of FIG. 2f may result in substantially the same deposition rate wherein the small discrepancy between the two processes may be readily compensated for by selecting an appropriate reduced deposition time, for instance by using a ratio of 5:6 compared to the deposition time used for a standard silicon dioxide hard mask.

Figure 2H:
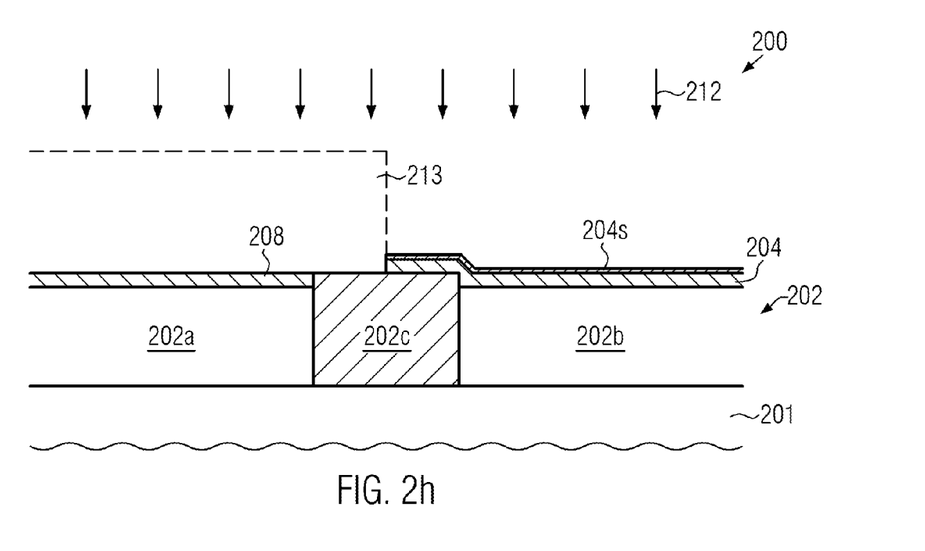

FIG. 2h schematically illustrates the device 200 after the deposition of the layer 208 when exposed to a reactive etch atmosphere 212 in order to remove the hard mask 204 comprising the modified surface 204s. To this end, in some illustrative embodiments, the etch process 212 may be performed on the basis of a plasma assisted etch process wherein, in some illustrative embodiments, substantially the same process recipe may be applied as is previously used for patterning the hard mask layer 204 during the etch process 211 as shown in FIG. 2d. In other cases, any other appropriate etch process may be applied. In one illustrative embodiment, the etch process 212 may be performed on the basis of an additional etch mask 213, such as a resist mask, thereby covering a portion of the isolation region 202c. In this case, any effect of the etch process 212 on the previously deposited layer 208 and on the exposed portion of the isolation region 202c may be avoided. In this manner, upon removing the mask layer 204, portions of the isolation region 202c in the vicinity of the active region 202a and in the vicinity of the active region 202b may experience substantially the same process history, thereby also contributing to a reduction of the overall surface topography within the isolation region 202c. After the etch process 212, the mask 213, if provided, may be removed on the basis of plasma hashing, wet strip processes and the like.

Figure 2I:
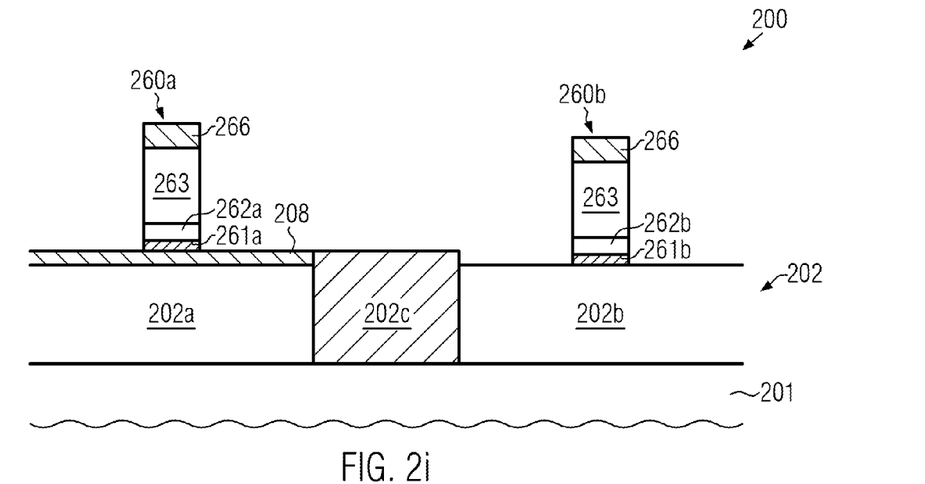

FIG. 2i schematically illustrates the semiconductor device 200 in a further advanced manufacturing stage. As illustrated, a first gate electrode structure 260a is formed on the active region 202a, which comprises the semiconductor alloy 208. Hence, the gate electrode structure 260a is formed on the threshold voltage adjusting semiconductor alloy 208. Similarly, a gate electrode structure 260b may be formed on the active region 202b. The gate electrode structures 260a, 260b may comprise gate dielectric layers 261a, 261b, respectively, which may comprise a high-k dielectric material, as is also explained above. Furthermore, respective metal-containing electrode materials 262a, 262b may be provided in the structures 260a, 260b, respectively, wherein basically the materials 261a, 262a on the one hand may have a different composition compared to the materials 261b, 262b on the other hand, in order to obtain the corresponding characteristics for the gate electrode structures 260a, 260b. Furthermore, the gate electrode structures 260a, 260b typically comprise a semiconductor-based electrode material 263 and a dielectric cap layer or cap layer system 266. The gate electrode structures 260a, 260b may be formed by depositing and patterning the materials 261a, 262a, 261b, 262b, possibly using additional anneal processes in order to provide the required electronic characteristics. Thereafter, the materials 263 and 266 may be deposited on the basis of any appropriate deposition techniques, followed by sophisticated lithography and patterning strategies in order to provide the required lateral dimensions. During the patterning process, the significantly reduced topography in the isolation region 202c may result in superior process results with respect to gate length and cross-sectional shape of the resulting gate electrode structures.

Figure 2J:
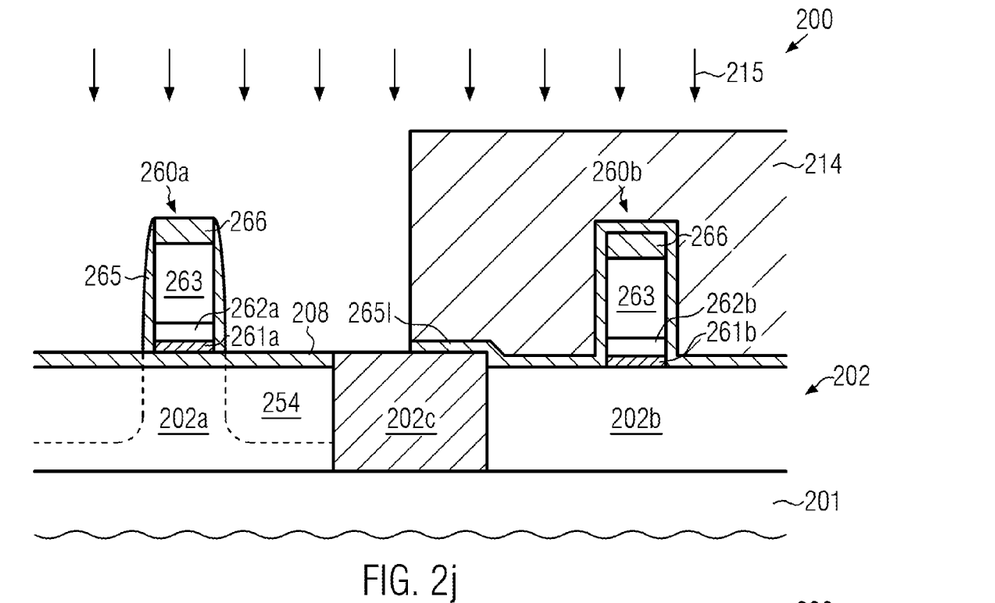

FIG. 2j schematically illustrates the device 200 in a further advanced manufacturing stage wherein, in some illustrative embodiments, as shown in FIG. 2j, cavities 254 may be formed selectively in the active region 202a so as to incorporate a strain-inducing semiconductor material, such as a silicon/germanium alloy and the like. To this end, a spacer layer 2651 may be deposited, for instance, on the basis of well-established sophisticated deposition techniques, in order to confine the sensitive materials 261a, 262a and 261b, 262b. The spacer layer 2651 may typically be comprised of silicon nitride and may have a thickness of two to several nanometers. Thereafter, an etch mask 214, such as a resist mask, is typically formed so as to expose the gate electrode structure 260a and the active region 202a. Thereafter, an etch sequence 215 may be applied so as to first pattern the spacer layer 2651 above the active region 202a into a liner or spacer 265 and subsequently to etch into the active region 202a in order to form cavities 254 therein, which are to be filled with a strain-inducing semiconductor alloy. Hence, after removing the resist mask 214 and performing any cleaning processes for preparing exposed surface areas for a further selective epitaxial growth process, a desired strain-inducing material may be formed in the cavities 254. It should be appreciated that, due to the reduced topography of the isolation region 202c, also superior integrity of the sensitive materials 261a, 262a may be accomplished during the process 215 and the subsequent epitaxial growth process, thereby significantly reducing gate failures which may be observed in conventional strategies when incorporating a strain-inducing semiconductor material into the active region 202a. Thereafter, the spacer layer 2651 may also be patterned into spacer elements on the gate electrode structure 260b and the further processing may be continued by forming drain and source regions in the active regions 202a, 202b.

Figure 2K:
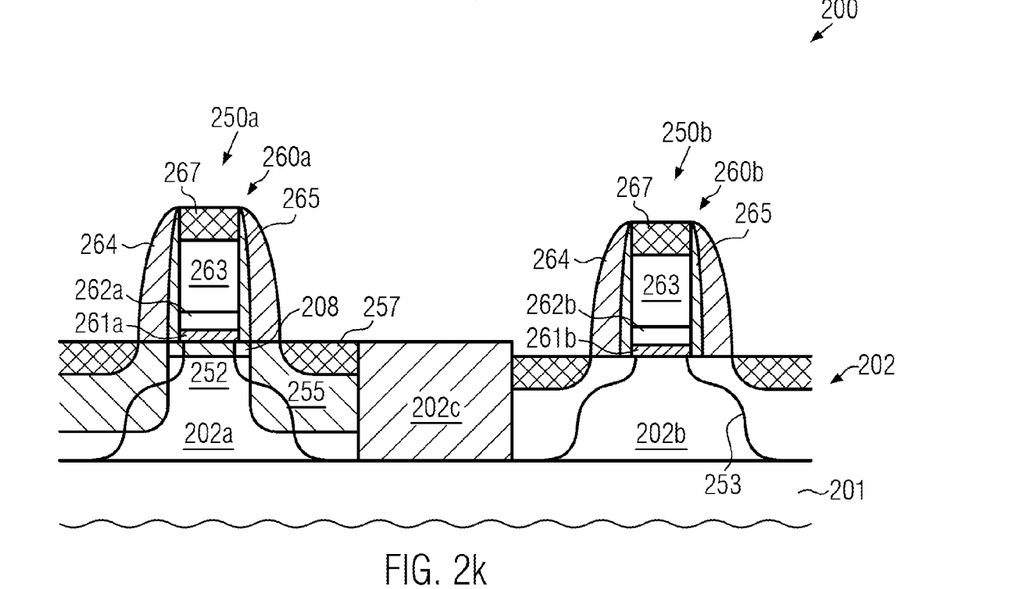

FIG. 2k schematically illustrates the semiconductor device 200 in a further advanced manufacturing stage. As shown, a first transistor 250a may be formed in and above the active region 202a, which may comprise a portion of the semiconductor alloy 208 at least below the gate dielectric material 261a. Furthermore, the active region 202a may comprise a strain-inducing semiconductor alloy 255, for instance in the form of silicon/germanium, silicon/tin, silicon/germanium/tin and the like, in order to induce a desired type of strain in a channel region 252 of the transistor 250a. Moreover, drain and source regions 253 may be formed in the active region 202a and, in some illustrative embodiments, a metal silicide 257 may be incorporated in the drain and source regions 253 so as to reduce the overall series resistance and the contact resistivity for the contact transistor 250a. Furthermore, as shown, a metal silicide 267 may also be formed in the semiconductor-based electrode material 263 and an additional sidewall spacer structure 264 may be provided in the gate electrode structure 260a. Furthermore, a second transistor 250b may be formed in and above the active region 202b and may comprise drain and source regions 253 and metal silicide regions 257. Moreover, the gate electrode structure 260b may have basically the same configuration as the gate electrode structure 260a except for the materials 261b, 262b, as discussed above.

The semiconductor device 200 as shown in FIG. 2k may be formed on the basis of any appropriate process strategy, for instance forming the drain and source regions 253 on the basis of well-established implantation and masking regimes, while also using the sidewall spacer structures 264 as an implantation mask. After any high temperature processes, the metal silicide regions 257 and 267 may be formed by any appropriate silicidation techniques. Consequently, the transistors 250a, 250b may be provided with sophisticated high-k metal gate electrode structures which may exhibit superior uniformity compared to conventional process strategies due to the significantly reduced surface topography of the isolation region 202c, as discussed above.

As a result, the present disclosure provides manufacturing techniques in which a threshold voltage adjusting semiconductor alloy may be selectively formed in one type of active region on the basis of a growth mask formed with a non-silicon dioxide base material, the surface of which may be modified so as to have silicon dioxide-like surface characteristics. In this manner, the patterning of the growth mask may be accomplished with a significantly reduced degree of material erosion in isolation regions, while nevertheless the modified surface may allow the application of well-established selective epitaxial growth recipes that are designed for silicon dioxide hard mask materials.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a hard mask layer on a first active region and a second active region of a semiconductor device;
    performing a surface treatment in an oxidizing atmosphere so as to form an oxidized surface on said hard mask layer;
    removing said hard mask layer selectively from said first active region;
    forming a layer of a semiconductor alloy on said first active region and using said hard mask layer on said second active region as a growth mask; and
    forming a first gate electrode structure of a first transistor on said layer of a semiconductor alloy and a second gate electrode structure of a second transistor on said second active region, said first and second gate electrode structures comprising a metal-containing electrode material and a gate insulation layer comprising a high-k dielectric material.

2. The method of claim 1, wherein forming said hard mask layer comprises forming a silicon and nitrogen containing material layer.

3. The method of claim 2, wherein performing said surface treatment comprises establishing a gaseous atmosphere including oxygen and hydrogen.

4. The method of claim 3, wherein performing said surface treatment further comprises adjusting a process temperature to 750-1100° C.

5. The method of claim 4, wherein performing said surface treatment further comprises establishing a pressure in said oxidizing atmosphere that is in the range of 3-20 Torr.

6. The method of claim 1, wherein removing said hard mask layer selectively from said first active region comprises performing a plasma assisted etch process.

7. The method of claim 1, further comprising removing said hard mask layer from said second active region after forming said layer of a semiconductor alloy by using a plasma assisted etch process.

8. The method of claim 1, further comprising removing said hard mask layer from said second active region after forming said layer of a semiconductor alloy by using an etch mask so as to cover said first active region and a portion of an isolation region.

9. The method of claim 8, wherein removing said hard mask layer selectively from said first active region and removing said hard mask layer from said second active region comprises applying an etch process performed on the basis of the same process recipe.

10. The method of claim 1, further comprising forming a strain-inducing semiconductor material in said first active region after forming said layer of a semiconductor alloy.

11. A method of forming a semiconductor device, the method comprising:
    forming a silicon and nitrogen containing hard mask layer on a first active region and a second active region;
    performing a surface treatment so as to modify a surface of said hard mask layer;
    removing said hard mask layer selectively from said first active region;
    forming a layer of a semiconductor alloy in said first active region by using said hard mask layer as a growth mask; and
    forming a first gate electrode structure of a first transistor on said first active region including said layer of a semiconductor alloy and a second gate electrode structure of a second transistor on said second active region.

12. The method of claim 11, wherein said surface treatment is performed in an oxidizing process atmosphere.

13. The method of claim 12, wherein performing said surface treatment comprises establishing a gaseous atmosphere including oxygen and hydrogen.

14. The method of claim 13, wherein performing said surface treatment further comprises adjusting a process temperature to 750-1100° C.

15. The method of claim 14, wherein performing said surface treatment further comprises establishing a pressure in said oxidizing atmosphere that is in the range of 3-20 Torr.

16. The method of claim 11, wherein forming said first and second gate electrode structures comprises forming a high-k dielectric material above said layer of a semiconductor alloy and said second active region and forming a metal-containing electrode material above said high-k dielectric material.

17. The method of claim 11, further comprising forming a strain-inducing semiconductor material in said first active region.

18. The method of claim 11, wherein removing said hard mask layer selectively from said first active region comprises performing a plasma assisted etch process.

19. A method, comprising:
  forming a silicon nitride layer on a first active region and a second active region of a semiconductor device;
  oxidizing a surface of said silicon nitride layer;
  removing said silicon nitride layer selectively from said first active region;
  forming a layer of a semiconductor alloy on said first active region and using said silicon nitride layer having said oxidized surface as a growth mask in said second active region;
  performing an etch process so as to expose said second active region; and
  forming a first gate electrode structure on said first active region and a second gate electrode structure on said second active region prior to completing drain and source regions in said first and second active regions, said first and second gate electrode structures comprising a high-k dielectric material and a metal-containing electrode material.

20. The method of claim 19, wherein said surface of said silicon nitride layer is oxidized by establishing an oxidizing atmosphere with oxygen and hydrogen at a process temperature of 750-1100° C.

\* \* \* \* \*